United States Patent
Vacassy et al.

(10) Patent No.: US 7,247,567 B2
(45) Date of Patent: Jul. 24, 2007

(54) METHOD OF POLISHING A TUNGSTEN-CONTAINING SUBSTRATE

(75) Inventors: Robert Vacassy, Aurora, IL (US); Dinesh N. Khanna, Naperville, IL (US); Alexander Simpson, Warrenville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 211 days.

(21) Appl. No.: 10/869,397

(22) Filed: Jun. 16, 2004

(65) Prior Publication Data

US 2005/0282391 A1 Dec. 22, 2005

(51) Int. Cl.
*H01L 21/302* (2006.01)
*H01L 21/461* (2006.01)

(52) U.S. Cl. ...................... 438/693; 438/692
(58) Field of Classification Search ........ 438/689–693, 438/745, 754; 216/13, 38, 83
See application file for complete search history.

(56) References Cited

U.S. PATENT DOCUMENTS

| | | | |
|---|---|---|---|
| 4,671,851 A * | 6/1987 | Beyer et al. ............... 438/426 |
| 4,944,836 A * | 7/1990 | Beyer et al. ............... 438/633 |
| 5,209,816 A * | 5/1993 | Yu et al. ..................... 438/693 |
| 5,340,370 A | 8/1994 | Cadien et al. |
| 6,117,783 A | 9/2000 | Small et al. |
| 6,136,711 A * | 10/2000 | Grumbine et al. .......... 438/692 |
| 6,194,317 B1 | 2/2001 | Kaisaki et al. |
| 6,284,151 B1 | 9/2001 | Krywanczyk et al. |
| 6,313,039 B1 | 11/2001 | Small et al. |
| 6,361,712 B1 | 3/2002 | Honda et al. |
| 6,530,968 B2 | 3/2003 | Tsuchiya et al. |
| 6,551,935 B1 | 4/2003 | Sinha et al. |
| 6,582,623 B1 | 6/2003 | Grumbine et al. |
| 6,589,439 B2 | 7/2003 | Honda et al. |
| 6,646,082 B2 | 11/2003 | Ghosh et al. |
| 2001/0032829 A1 | 10/2001 | Honda et al. |
| 2001/0041507 A1 | 11/2001 | Kaufman et al. |
| 2003/0063998 A1 | 4/2003 | Ghosh et al. |
| 2003/0139116 A1 | 7/2003 | Moeggenborg et al. |
| 2005/0079803 A1 * | 4/2005 | Siddiqui et al. .............. 451/41 |
| 2005/0211950 A1 * | 9/2005 | de Rege Thesauro et al. ... 252/79.1 |

FOREIGN PATENT DOCUMENTS

| | | |
|---|---|---|
| EP | 0131509 A2 | 1/1985 |
| EP | 0896042 | 2/1999 |
| EP | 0957400 A1 | 11/1999 |
| EP | 1205965 A1 | 5/2002 |
| WO | WO 00/00567 A1 | 1/2000 |
| WO | WO 03/068883 A1 | 8/2003 |
| WO | WO 03/072672 A1 | 9/2003 |

* cited by examiner

*Primary Examiner*—Zandra V. Smith
*Assistant Examiner*—Thanh Yen Tran
(74) *Attorney, Agent, or Firm*—Thomas Omholt; Frank Koszyk

(57) ABSTRACT

The invention provides a method of chemically-mechanically polishing a substrate comprising tungsten through use of a composition comprising a tungsten etchant, an inhibitor of tungsten etching, and water, wherein the inhibitor of tungsten polishing is a polymer, copolymer, or polymer blend comprising at least one repeating group comprising at least one nitrogen-containing heterocyclic ring or a tertiary or quaternary nitrogen atom. The invention further provides a chemical-mechanical polishing composition particularly useful in polishing tungsten-containing substrates.

20 Claims, No Drawings

METHOD OF POLISHING A TUNGSTEN-CONTAINING SUBSTRATE

FIELD OF THE INVENTION

This invention pertains to the chemical-mechanical polishing of substrates comprising tungsten. The invention further provides a polishing composition comprising ferric ion, a polymer, silica, malonic acid, and water.

BACKGROUND OF THE INVENTION

Integrated circuits are made up of millions of active devices formed in or on a substrate, such as a silicon wafer. The active devices are chemically and physically connected into a substrate and are interconnected through the use of multilevel interconnects to form functional circuits. Typical multilevel interconnects comprise a first metal layer, an interlevel dielectric layer, and sometimes a third and subsequent metal layer. Interlevel dielectrics, such as doped and undoped silicon dioxide ($SiO_2$) and/or low-κ dielectrics, are used to electrically isolate the different metal layers. As each layer is formed, typically the layer is planarized to enable subsequent layers to be formed on top of the newly formed layer.

Tungsten is increasing being used as a conductive material to form the interconnections in integrated circuit devices. One way to fabricate planar tungsten circuit traces on a silicon dioxide substrate is referred to as the damascene process. In accordance with this process, the silicon dioxide dielectric surface is patterned by a conventional dry etch process to form holes and trenches for vertical and horizontal interconnects. The patterned surface is coated with an adhesion-promoting layer such as titanium or tantalum and/or a diffusion barrier layer such as titanium nitride or tantalum nitride. The adhesion-promoting layer and/or the diffusion barrier layer are then over-coated with a tungsten layer. Chemical-mechanical polishing is employed to reduce the thickness of the tungsten over-layer, as well as the thickness of any adhesion-promoting layer and/or diffusion barrier layer, until a planar surface that exposes elevated portions of the silicon dioxide surface is obtained. The vias and trenches remain filled with electrically conductive tungsten forming the circuit interconnects.

Typically, chemical-mechanical polishing compositions for polishing tungsten-containing substrates comprise compounds capable of etching tungsten. The compounds capable of etching tungsten, or etchants, serve to convert tungsten into a soft oxidized film that is capable of controlled removal by mechanical abrasion. Abrasion is performed using abrasives suspended in a liquid carrier to form a polishing slurry in conjunction with a polishing pad or with abrasives fixed to a polishing pad, in which movement of the polishing pad relative to the substrate (i.e., a semiconductor wafer) with the polishing slurry therebetween causes mechanical removal of the soft oxidized film. However, the etchants often are capable of converting tungsten metal or its oxide directly into soluble forms of tungsten. In the polishing step, the over-coating layer of tungsten is removed to expose the oxide layer and to achieve planarity of the substrate. After exposure of the oxide layer and before completion of the polishing process, tungsten in the trenches undesirably can be eroded by a combination of static etching and by mechanical action of the abrasives, leading to dishing and erosion. Dishing may compromise circuit integrity and leads to surface non-planarity, which may complicate deposition of metal layers on subsequent levels of the device. Inhibitors of tungsten etching have been added to chemical-mechanical polishing compositions. For example, U.S. Pat. No. 6,273,786 discloses a chemical-mechanical polishing process comprising a tungsten corrosion inhibitor selected from the group consisting of phosphates, polyphosphates, silicates, and mixtures thereof. U.S. Pat. No. 6,083,419 discloses a chemical-mechanical polishing composition comprising an inhibitor of tungsten etching that is a compound selected from the group consisting of nitrogen-containing heterocycles without nitrogen-hydrogen bonds, sulfides, and oxazolidines.

However, such inhibitors are not always effective at preventing erosion of tungsten within trenches. Additionally, use of high levels of such inhibitors of tungsten etching can reduce the polishing rates of substrates comprising tungsten layers to unacceptably low levels. Erosion is a function not only of tungsten etching, but also of the abrasion process. Thus, there remains a need in the art for compositions and methods for chemical-mechanical planarization of tungsten-containing substrates that will provide for reduced erosion of tungsten and yet maintain useful rates of tungsten removal. The invention provides such a chemical-mechanical polishing composition and method. These and other advantages of the invention, as well as additional inventive features, will be apparent from the description of the invention provided herein.

BRIEF SUMMARY OF THE INVENTION

The invention provides a method of chemically-mechanically polishing a substrate comprising tungsten comprising (i) contacting a substrate comprising tungsten with a polishing pad and a chemical-mechanical polishing composition comprising (a) a tungsten etchant, (b) an inhibitor of tungsten etching, where the inhibitor of tungsten polishing is present in an amount of about 1 ppm to about 1000 ppm, and (c) water, (ii) moving the polishing pad relative to the substrate with the polishing composition therebetween, and (iii) abrading at least a portion of the substrate to polish the substrate. The inhibitor of tungsten etching is a polymer, copolymer, or polymer blend comprising at least one repeating group comprising at least one nitrogen-containing heterocyclic ring or a tertiary or quaternary nitrogen atom. The invention further provides a polishing composition comprising (a) ferric ion, (b) an inhibitor of tungsten etching, where the inhibitor of tungsten etching is present in an amount of about 1 ppm to about 1000 ppm, (c) silica, (d) malonic acid, and (e) water, wherein the inhibitor of tungsten etching is as recited above.

DETAILED DESCRIPTION OF THE INVENTION

The invention is directed to a method of polishing a substrate comprising tungsten. The method comprises (i) contacting a substrate comprising tungsten with a polishing pad and a chemical-mechanical polishing composition comprising (a) a tungsten etchant, (b) an inhibitor of tungsten etching, wherein the inhibitor of tungsten etching is present in an amount of about 1 ppm to about 1000 ppm, and (c) water, (ii) moving the polishing pad relative to the substrate with the polishing composition therebetween, and (iii) abrading at least a portion of the substrate to polish the substrate. The inhibitor of tungsten polishing is a polymer, copolymer, or polymer blend comprising at least one repeating group comprising at least one nitrogen-containing heterocyclic ring or a tertiary or quaternary nitrogen atom. The invention further provides a polishing composition comprising (a) ferric ion, (b) an inhibitor of tungsten etching, wherein the inhibitor of tungsten etching is as recited above, (c) silica, (d) malonic acid, and (e) water.

The method of the invention can be used to polish any suitable substrate that comprises tungsten, such as a semiconductor substrate. Generally, the inventive method is used to polish a tungsten layer of a substrate. For example, the method of the invention can be used to polish at least one tungsten metal layer associated with a substrate selected from the group consisting of silicon substrates, TFT-LCD (thin film transistor liquid crystal display) glass substrates, GaAs substrates, and other substrates associated with integrated circuits, thin films, multiple level semiconductors, wafers, and the like.

The chemical-mechanical polishing composition includes a tungsten etchant. The tungsten etchant can be any suitable compound or ionic species that etches tungsten. The term "compound or ionic species that etches tungsten" as used herein refers to a compound or ionic species that corrodes tungsten by turning solid tungsten metal into a soluble tungsten corrosion product. A compound or ionic species that etches tungsten may include one or more components that react with tungsten metal or its oxide to form soluble tungsten corrosion products. Generally, the process of corrosion is an oxidation process, in which electrons are transferred from solid tungsten metal to the compound or ionic species that etches tungsten, to form tungsten species with a higher oxidation state than that of solid tungsten metal or its oxide.

Examples of compounds that etch tungsten include but are not limited to oxidizing agents, fluoride-containing agents, and organic acids such as oxalic acid and malonic acid. The compound that etches tungsten desirably comprises at least one metal ion with a suitable oxidation potential. Preferably, the etchant is ferric ion, which can be provided by way of any suitable compound comprising ferric ion, e.g., a compound that disassociates in water to provide ferric ions, such as ferric nitrate.

Desirably, the etchant, such as ferric ion, is present in the chemical-mechanical polishing composition at a concentration of about 0.0002 M or more (e.g., about 0.001 M or more, or about 0.005 M or more, or about 0.01 M or more). Preferably, the etchant, such as ferric ion, is present at a concentration of about 0.4 M or less (e.g., about 0.2 M or less, or about 0.1 M or less).

The chemical-mechanical polishing composition includes an inhibitor of tungsten etching. The inhibitor of tungsten etching is a compound that inhibits the conversion of solid tungsten metal or its oxide into soluble tungsten compounds while allowing the composition to convert tungsten into a soft oxidized film that can be controllably removed by abrasion. Classes of compounds that are useful as inhibitors of tungsten etching in the context of the invention include polymers comprising repeating groups comprising at least one nitrogen-containing heterocyclic ring, and polymers comprising repeating groups comprising at least one tertiary or quaternary nitrogen atom. Preferred examples of polymers comprising at least one nitrogen-containing heterocyclic ring include polymers comprising imidazole rings. Preferred examples of polymers comprising a tertiary or quaternary nitrogen atom include copolymers of alkylated amine monomers and nonionic monomers.

As used herein, the term imidazole refers to a 5-membered cyclic structure having two nitrogen atoms and three carbon atoms, in which the nitrogen atoms are at the 1- and 3-positions on the ring, and the carbon atoms are at the 2-, 4-, and 5-positions on the ring.

The inhibitor of tungsten etching can be any polymer comprising heterocyclic nitrogen-containing rings. In a first embodiment, the inhibitor of tungsten etching is a polymer comprising imidazole rings. The polymer can be a polymer or copolymer containing only imidazole-containing repeating units, or can be a copolymer containing one or more imidazole-containing repeating units in combination with other repeating units, including but not limited to ethylene, propylene, ethylene oxide, propylene oxide, styrene, epichlorohydrin, and mixtures thereof. The copolymer can be a random copolymer, alternating copolymer, periodic copolymer, block copolymer (e.g., AB, ABA, ABC, etc.), graft copolymer, or comb copolymer.

The imidazole rings can be attached at the 1-, 2-, or 4-position of the imidazole ring. When the imidazole ring is attached to the polymer at the 2- or 4-positions, it is well appreciated in the art that one of the two ring nitrogen atoms can bear either a hydrogen atom or another functional group, for example, alkyl or aryl. When the imidazole ring is optionally substituted with an alkyl group on a ring nitrogen, the imidazole ring can be further quaternized, i.e., the alkyl group-substituted ring nitrogen can be bonded to four carbon atoms and have a positive charge. Furthermore, the imidazole rings can be further substituted with additional functional groups at any open position or can be annelated to a second ring as in, for example, benzimidazole. In a preferred embodiment, the polymer comprising imidazole rings is a polymer derived from the polymerization of 1-vinylimidazole, e.g., a poly(1-vinylimidazole).

In a second embodiment, the inhibitor of tungsten etching comprises a polymer comprising tertiary or quaternary nitrogen atoms. The polymer can consist of a single repeating group comprising tertiary or quaternary nitrogen atoms, or can be a copolymer containing one or more of such repeating units in combination with other repeating units, including but not limited to ethylene, propylene, ethylene oxide, propylene oxide, styrene, epichlorohydrin, 2,2'-dichloroethyl ether, and mixtures thereof. A desirable example of a polymer that consists of repeating groups comprising tertiary or quaternary nitrogen atoms is a polymer of a diallyldialkylamine salt. Preferably, the inhibitor of tungsten etching comprises a copolymer containing one or more repeating groups comprising a tertiary or quaternary nitrogen atom and one or more nonionic monomers. The copolymer can be a random copolymer, alternating copolymer, periodic copolymer, block copolymer (e.g., AB, ABA, ABC, etc.), graft copolymer, or comb copolymer. The inhibitor of tungsten etching can be a dialkylamine-epichlorohydrin copolymer. A preferred example of a dialkylamine-epichlorohydrin copolymer is poly(dimethylamine-co-epichlorohydrin). The polymer comprising tertiary or quaternary nitrogen atoms also can be a copolymer of 2,2'-dichlorodiethyl ether and a bis[Ω-(N,N-dialkyl)alkyl]urea. A preferred copolymer containing one or more repeating groups comprising a tertiary or quaternary nitrogen atom and one or more nonionic monomers is poly[bis(2-chloroethyl)ether-alt-1,3-bis[3-(dimethylamino)propyl]urea].

The inhibitor of tungsten etching can comprise a polymer blend of one or more inhibitors of tungsten etching of the invention. Many methods for blending of polymers are known in the art. One suitable method is coextrusion of two or more polymers. Other methods involve batch mixing of polymers. Any suitable method can be used to produce an inhibitor of tungsten etching that is a polymer blend.

The inhibitor of tungsten etching desirably is present in the chemical-mechanical polishing composition at the point-of-use in an amount of about 1 ppm or more (e.g., about 5 ppm or more, or about 10 ppm or more, or about 50 ppm or more). The inhibitor of tungsten etching desirably is present in the polishing composition at the point-of-use in an amount of about 1000 ppm or less (e.g., about 800 ppm or less, or about 600 ppm or less, or about 400 ppm or less). As utilized herein, the term "point-of-use" refers to the point at which the polishing composition is applied to the substrate surface (e.g., the polishing pad or the substrate surface itself).

While not wishing to be bound by any particular theory, it is believed that the polymeric inhibitor of tungsten etching interacts with the tungsten metal surface in a manner that permits conversion of tungsten metal to a soft oxidized film while inhibiting direct solubilization of tungsten or its oxide, and further serves to reduce, or substantially reduce, erosion due to mechanical abrasion of the tungsten metal itself. The polymeric inhibitor of tungsten etching may serve as a protective film on the surface of the tungsten metal that modulates mechanical erosion of tungsten on a substrate during chemical-mechanical polishing of a substrate.

The chemical-mechanical polishing composition optionally comprises an abrasive. The abrasive can be any suitable abrasive, many of which are well known in the art. A desirable abrasive is a metal oxide abrasive. Preferably, the abrasive is selected from the group consisting of alumina, ceria, silica, titania, zirconia, and mixtures thereof. More preferably, the abrasive is silica. The silica can be any suitable form of silica. Useful forms of silica include but are not limited to fumed silica, precipitated, and condensation-polymerized silica. The abrasive particles useful in the invention desirably have an average particle size (e.g., average particle diameter) of about 20 nm to about 500 nm. Preferably, the abrasive particles have an average particle size of about 70 nm to about 300 nm (e.g., about 100 nm to about 200 nm).

When an abrasive is present in the chemical-mechanical polishing composition and is suspended in water, any suitable amount of abrasive can be present in the polishing composition. Typically about 0.1 wt. % or more (e.g., about 0.2 wt. % or more, or 0.3 wt. % or more) of abrasive will be present in the polishing composition. The amount of abrasive in the polishing composition typically will be about 10 wt. % or less, and more typically will be about 5 wt. % or less (e.g., about 3 wt. % or less).

The abrasive particles preferably are colloidally stable. The term colloid refers to the suspension of abrasive particles in the liquid carrier. Colloidal stability refers to the maintenance of that suspension through time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). More preferably, the value of $[B]-[T]/[C]$ is less than or equal to 0.3, and most preferably is less than or equal to 0.1.

The chemical-mechanical polishing composition optionally comprises a per-compound. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, di-tert-butyl peroxide, monopersulfates ($SO_5^{2-}$), dipersulfates ($S_2O_8^{2-}$), and sodium peroxide. Preferably, the per compound is hydrogen peroxide.

When a per compound is present in the chemical-mechanical polishing composition, the per compound can be present in any suitable amount. The per compound preferably comprises about 10 wt. % or less (e.g., about 8 wt. % or less, or about 6 wt. % or less) of the composition.

The chemical-mechanical polishing composition desirably has a pH that is about 9 or less (e.g., about 8 or less, or about 6 or less, or about 4 or less). Preferably, the polishing composition has a pH of about 1 or more. Even more preferably, the polishing composition has a pH of about 1 to about 4. The polishing composition optionally comprises pH adjusting agents, for example nitric acid or potassium hydroxide. The polishing composition optionally comprises pH buffering systems, for example potassium hydrogen phthalate. Such pH buffering systems are well known in the art.

The chemical-mechanical polishing composition optionally comprises a stabilizer. It is well known that hydrogen peroxide and other per compounds are not stable in the presence of many metal ions without the use of stabilizers. Without the stabilizer, the metal ion or ions and the per compound may react in a manner that degrades the per compound over time. The stabilizer may also interact with the compound that etches tungsten in the compositions of the invention and reduce the effectiveness of the etchant. Therefore, the selection of the choice and of the amount of the stabilizer can be important and can influence the effectiveness of the polishing composition.

Useful stabilizers include but are not limited to phosphoric acid, organic acids (e.g., malonic acid, citric acid, adipic acid, oxalic acid, phthalic acid, and ethylenediaminetetraacetic acid), nitrites, and other ligands that are capable of binding to metal ions and reduce their reactivity towards per compounds. It will be appreciated that the aforementioned acids can exist in the form of a salt (e.g., a metal salt, an ammonium salt, or the like), an acid, or as a partial salt thereof. For example, malonates include malonic acid, as well as mono- and di-salts thereof. Preferred stabilizers are selected from the group consisting of malonic acid, citric acid, adipic acid, oxalic acid, and mixtures thereof. An especially preferred stabilizer is malonic acid.

The stabilizer can be present in the chemical-mechanical polishing composition in any suitable amount. Desirably, the amount of stabilizer is based on the amount of the tungsten etchant that is present in the composition. Preferably, the amount of stabilizer will be about 1 molar equivalent or more (e.g., about 2 molar equivalents or more). The amount of stabilizer will typically be less than about 5 molar equivalents.

The chemical-mechanical polishing composition optionally further comprises one or more other additives. Such additives include any suitable surfactant and/or rheological control agent, including viscosity enhancing agents and coagulants (e.g., polymeric rheological control agents, such as, for example, urethane polymers), acrylates comprising one or more acrylic subunits (e.g., vinyl acrylates and styrene acrylates), and polymers, copolymers, and oligomers thereof, and salts thereof. Suitable surfactants include, for example, anionic surfactants, cationic surfactants, anionic polyelectrolytes, cationic polyelectrolytes, nonionic surfactants, amphoteric surfactants, fluorinated surfactants, mixtures thereof, and the like.

The chemical-mechanical polishing composition can be produced by any suitable technique, many of which are known to those skilled in the art. For example, the tungsten etchant and the inhibitor of tungsten etching may be combined in water before applying the polishing composition to a substrate comprising tungsten or they may be applied separately to a polishing pad or to a substrate before or during substrate polishing. Generally, the components of the polishing composition may be prepared by combining the ingredients in any order. The term "component" as used herein includes individual ingredients (e.g., acids, bases, etc.) as well as any combination of ingredients (e.g., acids, bases, surfactants, etc.).

For example, the tungsten etchant and the inhibitor of tungsten etching can be combined in water at predetermined concentrations and mixed until such components are completely dissolved. A concentrated dispersion of an abrasive, if used, then can be added, and the mixture diluted to give the desired concentration of abrasive in the final polishing composition. Optionally, a per-compound, a stabilizer, and other additives can be added to the polishing composition at any time during the preparation of the polishing composition, e.g., before or after addition of the tungsten etchant and the inhibitor of tungsten etching, and before or after adding the abrasive, if an abrasive is desired, and mixed by any method that is capable of incorporating the additives into the polishing composition. The mixture can be filtered, if desired, to remove large particulate contaminants such as dirt or packaging materials before use.

The polishing composition can be prepared prior to use, with one or more components, such as the per-compound, added to the polishing composition just before use (e.g., within about 1 minute before use, or within about 5 minutes before use, or within about 1 hour before use, or within about 24 hours before use, or within about 7 days before use). For example, the inhibitor of tungsten etching may decompose in the presence of the tungsten etchant or in the presence of the per compound. In such a situation, the inhibitor of tungsten etching may be added to the polishing composition immediately before use (e.g., within about 1 minute before use, or within about 5 minutes before use, or within about 1 hour before use, or within about 24 hours before use, or within about 7 days before use).

The chemical-mechanical polishing composition can be supplied as a one package system comprising tungsten etchant and an inhibitor of tungsten etching. Optional components, such as an abrasive and/or a per-compound, can be placed in a second or third container. Furthermore, the components in the first or second container can be in dry form while the components in the corresponding container can be in the form of an aqueous dispersion. If the per-compound is a solid, it may be supplied either in dry form or as an aqueous mixture. The per-compound can be supplied separately from the other components of the polishing composition. Other two-container, or three- or more container, combinations of the components of the polishing composition are within the knowledge of one of ordinary skill in the art.

The chemical-mechanical polishing composition preferably comprises about 0.4 M or less of ferric nitrate or ferric ions, about 1000 ppm or less of a polymer selected from the group consisting of polyvinylimidazole, dimethylamine-epichlorohydrin copolymer, and poly[bis(2-chloroethyl)ether-alt-1,3-bis[3-(dimethylamino)propyl]urea], hydrogen peroxide, silica, and water, wherein the pH is about 1 to about 6. More preferably, the chemical-mechanical polishing composition comprises about 0.2 mM to about 0.4 M of ferric ion, about 1 ppm to about 1000 ppm of a polymer selected from the group consisting of polyvinylimidazole, dimethylamine-epichlorohydrin copolymer, and poly[bis(2-chloroethyl)ether-alt-1,3-bis[3-(dimethylamino)propyl]urea], about 0.2 wt. % to about 3 wt. % of silica, about 0.1 wt. % to about 10 wt. % of hydrogen peroxide, and water. The recited concentrations of specified components refer to the concentrations at the point-of-use.

In the method of chemically-mechanically polishing a tungsten-containing substrate (such as a semiconductor wafer), the substrate typically will be pressed against a polishing pad in the presence of a polishing composition under controlled chemical, pressure, velocity, and temperature conditions. The relative motion of the substrate and pad can be circular, elliptical, or linear. Typically, the relative motion of the substrate and pad is circular.

Any suitable polishing pad can be used in the method of the invention. Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

The invention also provides a polishing composition comprising ferric ion, an inhibitor of tungsten etching, wherein the inhibitor of tungsten etching is a polymer, copolymer, or polymer blend comprising at least one repeating group comprising at least one nitrogen-containing heterocyclic ring or a tertiary or quaternary nitrogen atom, wherein the inhibitor of tungsten etching is present at the point of use in an amount of about 1 ppm to about 1000 ppm, silica, malonic acid, and water. The other features of this polishing composition (e.g., the amount of ferric ion, the amount of silica, the amount of malonic acid, the pH, and other suitable additives) are the same as set forth above for the chemical-mechanical polishing composition useful in the method of the invention.

The polishing composition can be used to polish any suitable substrate, for example, by (a) contacting a substrate with the chemical-mechanical polishing composition and a polishing pad, (b) moving the polishing pad relative to the substrate with the chemical-mechanical polishing composition therebetween, and (c) abrading at least a part of the substrate to polish the substrate. The chemical-mechanical polishing composition is especially useful in the method of the invention described above.

The following examples further illustrate the invention but, of course, should not be construed as in any way limiting its scope.

EXAMPLE 1

This example compares the static etch rates observed when a polishing composition useful in the inventive method, a composition comprising imidazole, and a control composition are exposed to a tungsten-containing substrate.

Similar planar tungsten wafers were exposed to six different compositions (Compositions 1A, 1B, 1C, 1D, 1E, and 1F). Each of the compositions comprised about 0.5 wt. % silica, 0.4143 wt. % of a 10 wt. % aqueous solution of ferric nitrate (i.e., 0.0017 M ferric nitrate), and about 320 ppm of malonic acid in water, and had a pH of about 2.3. Composition 1A (control) did not contain any other components. Compositions 1B, 1C, and 1D (comparative) additionally contained 100 ppm, 500 ppm, and 1000 ppm of imidazole, respectively. In contrast, Compositions 1E and 1F (invention) contained 100 ppm and 125 ppm of polyvinylimidazole, respectively.

The planar tungsten wafers were immersed in each of the compositions at about 43.3° C. for 5 minutes, and the tungsten static etch rate (in angstroms per minute) was determined for each of the compositions by measuring the change in wafer thickness and dividing the change in thickness by 5. The results are summarized in Table 1.

TABLE 1

Tungsten Etch Rates

| Composition | Etch Rate (Å/min) |
| --- | --- |
| 1A (control) | 255.8 |
| 1B (comparative) | 192.2 |
| 1C (comparative) | 202.4 |
| 1D (comparative) | 198.9 |
| 1E (invention) | 161.5 |
| 1F (invention) | 138.4 |

As is apparent from the data set forth in Table 1, Compositions 1E and 1F containing 100 ppm and 125 ppm of polyvinylimidazole, respectively, showed reductions in the static etch rate of about 37% and about 46% respectively as compared to the control compositions, i.e., Composition 1A. Compositions 1B, 1C, and 1D containing 100 ppm, 500 ppm, and 1000 ppm of imidazole, respectively, showed reductions in the static etch rate of about 25%, 21%, and 22%, respectively, as compared to the control composition, i.e., Composition 1A. These results demonstrate that polishing compositions containing inhibitors of tungsten etching in accordance with the invention exhibit significantly less static etching as compared to compositions containing imidazole and the control composition.

EXAMPLE 2

This example demonstrates the effect on erosion of patterned tungsten-containing wafers resulting from addition of the inhibitors of tungsten etching to a polishing composition in accordance with the invention.

Similar substrates comprising tungsten overlaid onto patterned silicon dioxide coated with a Ti/TiN barrier layer were used as the test substrates. The width of the trenches within the pattern was 2 microns, the width of silicon dioxide between trenches was 2 microns, and the pattern density was 50%. A commercially available polishing tool was used to polish the substrates with the compositions. The polishing parameters were as follows: polishing sub-carrier pressure of 21.5 kPa (3.125 psi), back pressure of 21.5 kPa (3.125 psi), table speed of 100 rpm, carrier speed of 55 rpm, ring pressure of 19.0 kPa (2.77 psi), polishing composition delivery rate of 150 ml/min, and ex-situ pad conditioning using a IC 1000 K-grooved/Suba IV polishing pad.

Six different compositions were used to chemically-mechanically polish the substrates (Compositions 2A, 2B, 2C, 2D, 2E, and 2F). Each of the compositions comprised about 0.5 wt. % silica, 0.4143 wt. % of a 10 wt. % aqueous solution of ferric nitrate (i.e., 0.0017 M ferric nitrate), and about 320 ppm of malonic acid in water, and had a pH of about 2.3. Composition 2A (control) did not contain any other components. Composition 2B (comparative) additionally contained 100 ppm of imidazole. Composition 2C (invention) additionally contained 100 ppm of poly(1-vinylimidazole). Composition 2D (invention) additionally contained 70 ppm of poly(dimethylamine-co-epichlorohydrin). Composition 2E (invention) additionally contained 100 ppm of [bis(2-chloroethyl)ether-alt-1,3-bis[3-(dimethylamino)propyl]urea]. Composition 2F (invention) additionally contained 100 ppm of poly(diallyldimethylammonium)chloride.

The substrates were polished at endpoint plus 20% overpolish. Erosion was determined as the difference in height of oxide within the pattern and height of oxide outside of the pattern, using a plane parallel to the surface of the substrate as a reference. The results are summarized in Table 2.

TABLE 2

Erosion Amounts

| Composition | Erosion (Å) |
| --- | --- |
| 2A (control) | 277.4 |
| 2B (comparative) | 376.8 |
| 2C (invention) | −8 |
| 2D (invention) | 34.6 |
| 2E (invention) | 91.2 |
| 2F (invention) | 49 |

As is apparent from the data set forth in Table 2, Composition 2B (comparative) exhibited an approximately 36% increase in erosion as compared with the control composition, i.e., Composition 2A. Composition 2C (invention) exhibited essentially no erosion. Compositions 2D, 2E, and 2F (invention) exhibited approximately 87%, 67%, and 82% decreases in erosion, respectively, as compared to the control composition, i.e., Composition 2A. These results demonstrate that erosion of a tungsten-containing layer can be substantially reduced through the use of a polishing composition in accordance with the invention.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of chemically-mechanically polishing a substrate comprising tungsten, which method comprises:
   (i) contacting a substrate with a polishing pad and a chemical-mechanical polishing composition comprising:
      (a) a tungsten etchant,
      (b) an inhibitor of tungsten etching, wherein the inhibitor of tungsten etching is a polymer, copolymer, or polymer blend comprising at least one repeating group comprising at least one nitrogen-containing heterocyclic ring or a tertiary or quaternary nitrogen atom,
      wherein the inhibitor of tungsten etching is present in an amount of about 1 ppm to about 1000 ppm, and
      (c) water,
   (ii) moving the polishing pad relative to the substrate with the polishing composition therebetween, and
   (iii) abrading at least a portion of the substrate to polish the substrate.

2. The method of claim 1, wherein the tungsten etchant is ferric ion.

3. The method of claim 2, wherein ferric nitrate is the source of the ferric ion.

4. The method of claim 2, wherein ferric ion is present in a concentration of about 0.0002 M to about 0.4 M.

5. The method of claim 1, wherein the inhibitor of tungsten etching is a polyvinylimidazole.

6. The method of claim 5, wherein the inhibitor of tungsten etching is a poly(1-vinylimidazole).

7. The method of claim 1, wherein the inhibitor of tungsten etching is a dialkylamine-epichlorohydrin copolymer.

8. The method of claim 1, wherein the inhibitor of tungsten etching is a copolymer of 2,2'-dichlorodiethyl ether and a bis[$\Omega$-(N,N-dialkyl)alkyl]urea.

9. The method of claim 1, wherein the polishing composition further comprises a metal oxide abrasive selected from the group consisting of alumina, ceria, silica, titania, zirconia, and mixtures thereof.

10. The method of claim 9, wherein the metal oxide abrasive is silica.

11. The method of claim 1, wherein the polishing composition further comprises a per-compound.

12. The method of claim 11, wherein the per-compound is hydrogen peroxide.

13. The method of claim 12, wherein hydrogen peroxide is present in the polishing composition in an amount of about 0.1 wt. % to about 10 wt. %.

14. The method of claim 1, wherein the pH of the polishing composition is about 1 to about 9.

15. The method of claim 14, wherein the pH of the polishing composition is about 1 to about 6.

16. The method of claim 15, wherein the pH of the polishing composition is about 1 to about 4.

17. The method of claim 1, wherein the polishing composition further comprises a stabilizer.

18. The method of claim 17, wherein the stabilizer comprises an organic acid.

19. The method of claim 18, wherein the organic acid is selected from the group consisting of malonic acid, citric acid, adipic acid, oxalic acid, and mixtures thereof.

20. The method of claim 1, wherein the chemical-mechanical polishing composition comprises:
   (a) about 0.0002 M to about 0.4 M of ferric nitrate,
   (b) about 1 ppm to about 1000 ppm of a polymer selected from the group consisting of polyvinylimidazole, dimethylamine-epichlorohydrin copolymer, and poly[bis(2-chloroethyl)ether-alt-1,3-bis[3-(dimethylamino)propyl]urea],
   (c) hydrogen peroxide,
   (d) silica, and
   (e) water,
wherein the pH is about 1 to about 6.

* * * * *